(12) United States Patent
Ide

(10) Patent No.: US 8,765,526 B2
(45) Date of Patent: Jul. 1, 2014

(54) METHOD OF MANUFACTURING SEMICONDUCTOR DEVICE INCLUDING PLURAL SEMICONDUCTOR CHIPS STACKED TOGETHER

(76) Inventor: Akira Ide, Tokyo (JP)

(*) Notice: Subject to any disclaimer, the term of this patent is extended or adjusted under 35 U.S.C. 154(b) by 246 days.

(21) Appl. No.: 13/333,328

(22) Filed: Dec. 21, 2011

(65) Prior Publication Data

US 2012/0164788 A1 Jun. 28, 2012

(30) Foreign Application Priority Data

Dec. 24, 2010 (JP) ................................. 2010-288037

(51) Int. Cl.
*H01L 21/50* (2006.01)
(52) U.S. Cl.
USPC .................... 438/106; 438/109; 257/E21.499
(58) Field of Classification Search
USPC .......................................... 438/106–109, 127
See application file for complete search history.

(56) References Cited

U.S. PATENT DOCUMENTS

| 7,888,179 | B2 * | 2/2011 | Kagaya et al. | 438/113 |
| 8,372,693 | B2 * | 2/2013 | Katagiri et al. | 438/109 |
| 8,575,763 | B2 * | 11/2013 | Yoshida et al. | 257/777 |
| 2009/0218671 | A1 | 9/2009 | Kuwabara | |
| 2011/0084722 | A1 * | 4/2011 | Nishioka | 324/762.01 |
| 2011/0115085 | A1 | 5/2011 | Kuwabara | |
| 2013/0137216 | A1 * | 5/2013 | Ito et al. | 438/108 |

FOREIGN PATENT DOCUMENTS

| JP | 2006-49417 A | 2/2006 |
| JP | 2009-182007 A | 8/2009 |
| JP | 2009-239256 A | 10/2009 |

* cited by examiner

*Primary Examiner* — Savitr Mulpuri
(74) *Attorney, Agent, or Firm* — Foley & Lardner LLP

(57) ABSTRACT

Such a method is disclosed that includes preparing first and second semiconductor chips, the first semiconductor chip including a first electrode formed on one surface thereof and a second electrode formed on the other surface thereof so as to overlap the first electrode as viewed from a stacking direction, and the second semiconductor chip including a third electrode formed on one surface thereof and a fourth electrode formed on the other surface thereof so as not to overlap the third electrode as viewed from the stacking direction, and stacking the first and second semiconductor chips in the stacking direction so that the second electrode is connected to the third electrode by using a bonding tool including a concave at a position corresponding to the fourth electrode.

10 Claims, 15 Drawing Sheets

METHOD OF MANUFACTURING SEMICONDUCTOR DEVICE INCLUDING PLURAL SEMICONDUCTOR CHIPS STACKED TOGETHER

BACKGROUND OF THE INVENTION

1. Field of the Invention

The present invention relates to a method of manufacturing a semiconductor device, and more particularly relates to a method of manufacturing a stacked semiconductor device having a plurality of semiconductor chips stacked thereon.

2. Description of Related Art

The memory capacity required for semiconductor memory devices such as DRAM (Dynamic Random Access Memory) has been increasing year by year. To satisfy this demand, a memory device called a multi-chip package, which has a plurality of memory chips stacked thereon, has been proposed in recent years. In the multi-chip package, however, a wire that connects each memory chip to a package substrate has to be provided for each chip. Therefore, it is difficult to stack a large number of memory chips.

Meanwhile, another type of semiconductor device having a plurality of memory chips stacked thereon with through silicon vias has been proposed in recent years. In this type of semiconductor device, among through silicon vias provided in the respective memory chips, through silicon vias at the same planar position as viewed from a stacked direction are electrically short-circuited. Accordingly, even when the number of stacked memory chips is increased, the number of electrodes connected to a package substrate is not increased. Therefore, more memory chips can be stacked.

When semiconductor chips with through silicon vias are stacked, a through silicon via on an upper chip has to accurately contact a through silicon via on a lower chip. Therefore, as compared to an operation of stacking chips in the multi-chip package, alignment needs a higher accuracy. As a device having semiconductor chips stacked thereon with through silicon vias, a device described in Japanese Patent Application Laid-open No. 2006-49417 has been known.

However, according to stacked semiconductor devices, there are cases where chips that a planar position of an electrode on a front surface is different from that of an electrode on a back surface are stacked (see Japanese Patent Application Laid-open No. 2009-239256). When these chips are stacked by a bonding tool, the planar position of a chip contacting the bonding tool is different from the planar position of the chip contacting an underlying chip. Consequently, a bending moment is generated on the chips at the time of stacking and these chips may be damaged. Such a problem is particularly conspicuous when the thickness of the chip is made as thin as about 50 μm, for example.

SUMMARY

In one embodiment, there is provided a method of manufacturing a semiconductor device that includes: preparing first and second semiconductor chips, the first semiconductor chip including a first electrode formed on one surface thereof and a second electrode formed on the other surface thereof so as to overlap the first electrode as viewed from a stacking direction, and the second semiconductor chip including a third electrode formed on one surface thereof and a fourth electrode formed on the other surface thereof so as not to overlap the third electrode as viewed from the stacking direction; and stacking the first and second semiconductor chips in the stacking direction so that the second electrode is connected to the third electrode by using a bonding tool including a concave at a position corresponding to the fourth electrode.

In another embodiment, there is provided a method of manufacturing a semiconductor device comprising: preparing first and second semiconductor chips, the first semiconductor chip including a first electrode formed on one surface thereof and a second electrode formed on the other surface thereof so as to overlap the first electrode as viewed from a stacking direction, and the second semiconductor chip including third electrode formed on one surface thereof and a fourth electrode formed on the other surface thereof so as not to overlap the third electrode as viewed from the stacking direction; holding the first semiconductor chip on a stage that includes a first holding surface so that the one surface of the first semiconductor chip faces toward the first holding surface; holding the second semiconductor chip on a bonding tool that includes a second holding surface having a concave so that the other surface of the second semiconductor chip faces toward the second holding surface, and so that the fourth electrode is placed in the concave; relatively moving the bonding tool and the stage so as to align the third electrode of the second semiconductor chip with the second electrode of the first semiconductor chip; and mounting the second semiconductor chip on the first semiconductor chip after moving so that the third electrode of the second semiconductor chip is connected to the second electrode of the first semiconductor chip.

BRIEF DESCRIPTION OF THE DRAWINGS

The above and other features and advantages of the present invention will be more apparent from the following description f certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
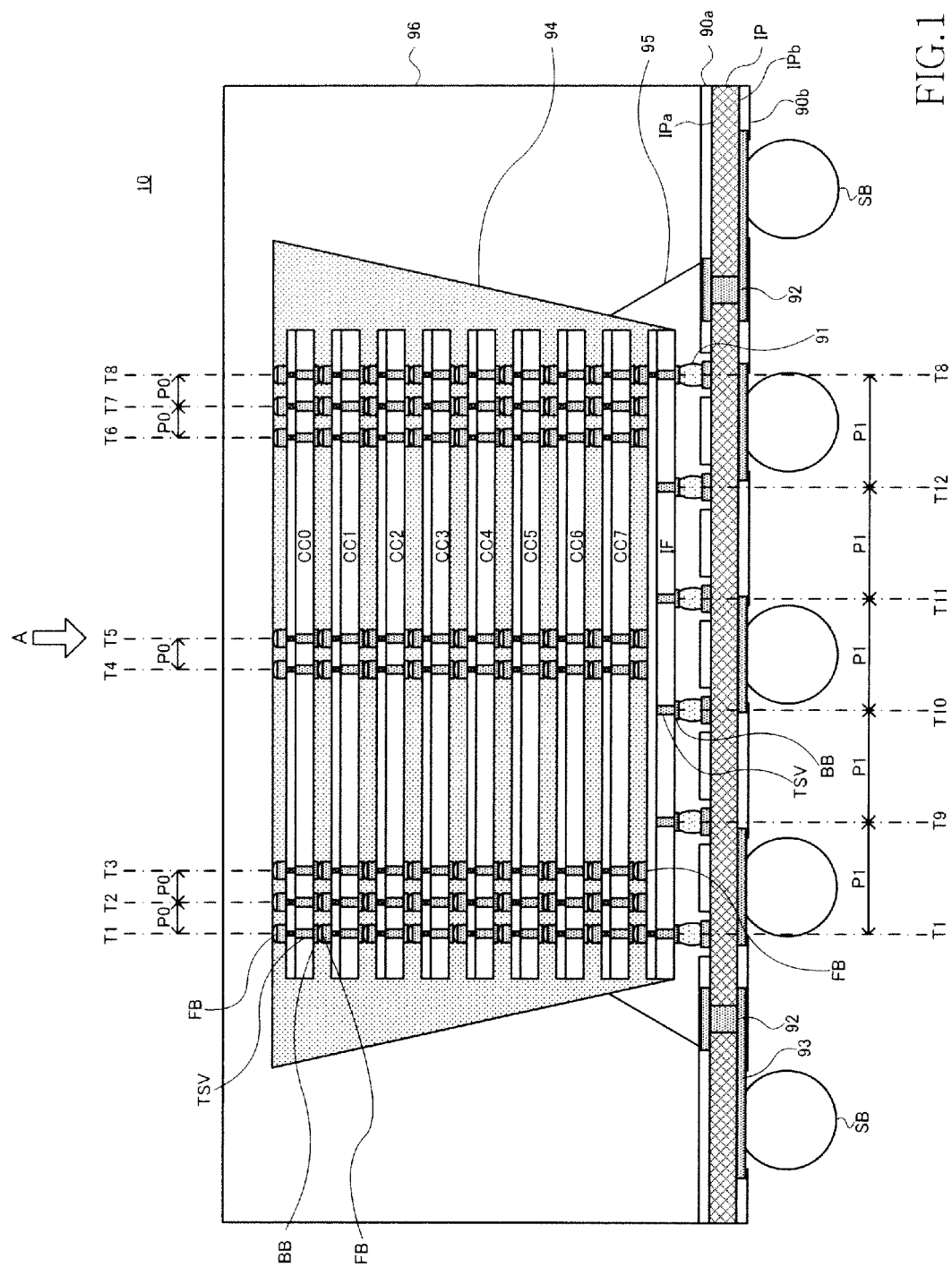
FIG. 1 is a schematic cross-sectional view for explaining a configuration of a semiconductor device according to an embodiments of the present invention.

Referring now to FIG. 1, the semiconductor device 10 according to the first embodiment is constituted by stacking eight core chips CC0 to CC7 that have the same function and the same configuration and are manufactured by the same manufacturing mask, an interface chip IF manufactured by a manufacturing mask different from that of the core chips CC0 to CC7, and an interposer IP. The core chips CC0 to CC7 and the interface chip IF are semiconductor chips using a silicon substrate and electrically connected to vertically adjacent chips by a large number of the through silicon vias TSV that penetrate silicon substrates. The interposer IP is a circuit substrate made of a resin and its back surface IPb is provided with a plurality of external terminals (solder balls) SB.

The core chips CC0 to CC7 are obtained by removing a so-called front end part that interfaces with outside among circuit blocks included in a normal SDRAM (Synchronous Dynamic Random Access Memory) that operates in a stand-alone manner. In other words, the core chips are memory chips in which only circuit blocks belonging to a back end part are integrated. Examples of circuit blocks included in the front end part include a parallel/serial conversion circuit that performs parallel/serial conversion on input/output data between a memory cell array and a data input/output terminal, and a DLL (Delay Locked Loop) circuit that controls a timing of inputting/outputting data.

Meanwhile, the interface chip IF is a semiconductor chip in which only the front end part is integrated among circuit blocks included in a normal SDRAM that operates in a stand-alone manner. The interface chip IF functions as a front end part common to the eight core chips CC0 to CC7. Accordingly, all external accesses are made through the interface chip IF and data is input and output also through the interface chip IF.

The interposer IP ensures the mechanical strength of the semiconductor device 10 and functions as a rewiring substrate for extending an electrode pitch. That is, an electrode 91 formed on a top surface IPa of the interposer IP is extracted to the back surface IPb by a through-hole electrode 92 and the pitch of the external terminal SB is extended by a rewiring layer 93 on the back surface IPb. A part of the top surface IPa of the interposer IP that the electrode 91 is not formed is covered by a resist 90a. A part of the back surface IPb of the interposer IP that the external terminal SB is not formed is covered by a resist 90b. While only five external terminals SB are shown in FIG. 1, a large number of external terminals are provided in practice. The layout of the external terminals SB is the same as that in an SDRAM defined by standards. Therefore, an external controller can handle the device as a single SDRAM.

An underfill 94 is filled in the spaces between the stacked core chips CC0 to CC7 and the interface chip IF and thus the mechanical strength is ensured. An NCP (Non-Conductive Paste) 95 is filled in the space between the interposer IP and the interface chip IF. An entire package is covered by a mold resin 96. With this configuration, the respective chips are physically protected.

The through silicon vias TSV provided in the core chips CC0 to CC7 are arranged at a processible minimum pitch P0 for suppressing an increase in chip size. Meanwhile, the through silicon vias TSV provided in the interface chip IF are arranged at a pitch P1 (>P0) that is allowed in a wiring rule for the interposer IP. While eight through silicon vias TSV placed in columns T1 to T8 of each of the core chips CC0 to CC7 and six through silicon vias TSV placed in columns T1 and T0 to T12 of the interface chip IF are shown in FIG. 1, more through silicon vias TSV are provided in practice.

Figures 2A, 2B, 2C:
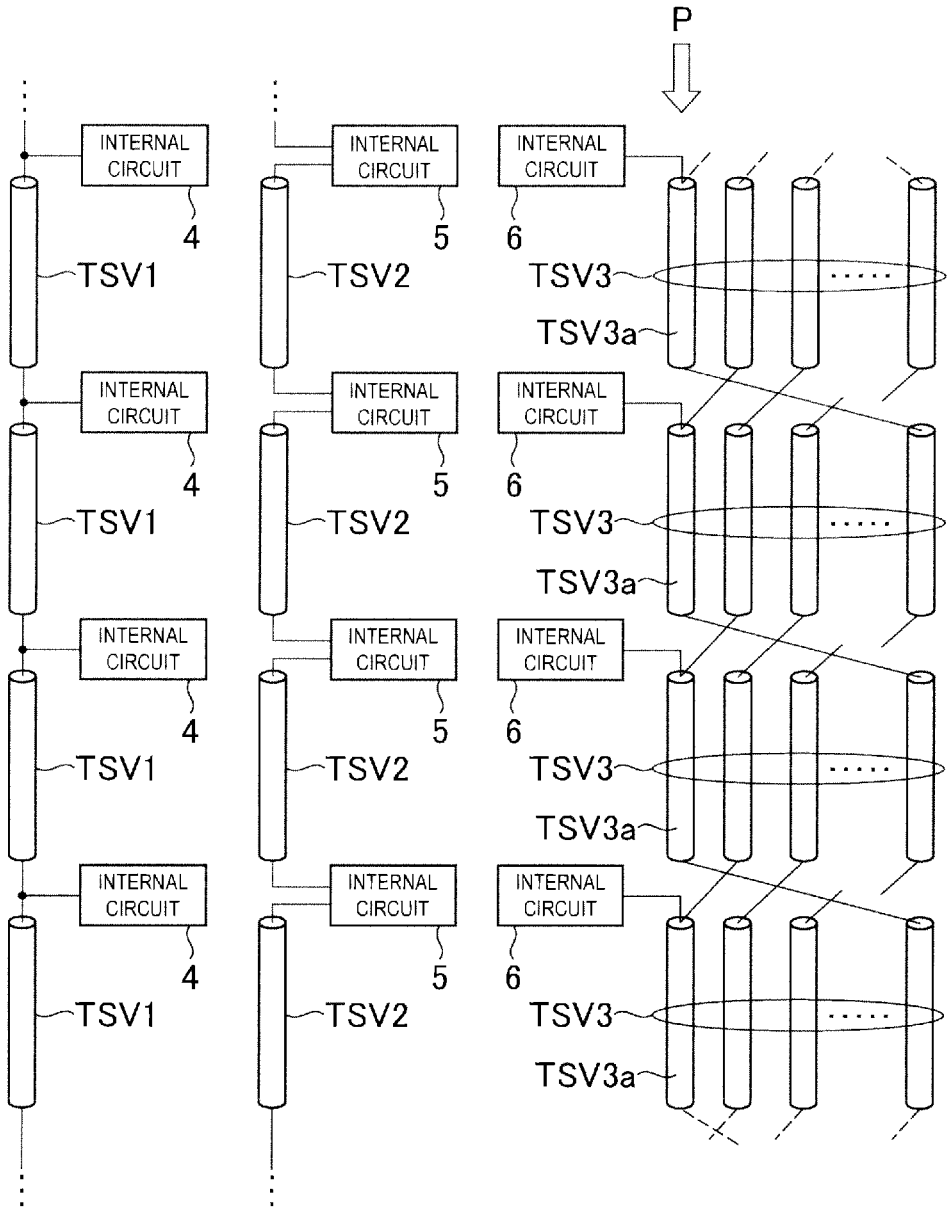
FIGS. 2A to 2C are explanatory diagram of types of through silicon vias provided in core chips.

Most through silicon vias TSV provided in the core chips CC0 to CC7 are short-circuited to the through silicon vias TSV provided at same positions of other layers in a planar view from a stacked direction, that is, as viewed from an arrow A shown in FIG. 1. That is, as shown in FIG. 2A, an upper through silicon via TSV1 and a lower through silicon via TSV1 provided at the same position in a planar view are short-circuited and these through silicon vias TSV1 constitute a wire. The through silicon vias TSV1 provided in the respective core chips CC0 to CC7 are connected to internal circuits 4 in corresponding core chips. Input signals (a command signal and an address signal) supplied from the interface chip IF to the through silicon vias TSV1 shown in FIG. 2A are commonly input to the respective internal circuits 4 of the core chips CC0 to CC7. Output signals (data) supplied from the core chips CC0 to CC7 to the through silicon vias TSV1 are wired-OR to be input to the interface chip IF.

Meanwhile, regarding some through silicon vias TSV, they are not directly connected to through silicon vias TSV2 of other layers at same positions in a planar view, but connected to each other through internal circuits 5 provided in the core chips CC0 to CC7 as shown in FIG. 2O. That is, these internal circuits 5 provided in the respective core chips CC0 to CC7 are cascade-connected to each other through the through silicon vias TSV2. This type of through silicon via TSV2 is used for successively transferring predetermined information to the internal circuit 5 provided in each of the core chips CC0 to CC7. An example of such information includes chip address information.

Furthermore, some other through silicon vias TSV are short-circuited to the through silicon vias TSV provided at different positions in a planar view as shown in FIG. 2C. According to this type of through silicon via group TSV3, through silicon vias TSV3a at a predetermined position P in a planar view are connected to internal circuits 6 of the respective core chips CC0 to CC7. With this configuration, information can be selectively input to the internal circuits of the respective core chips. An example of such information includes defective chip information.

As described above, there are three types (TSV1 to TSV3) of the through silicon vias TSV provided in the core chips CC0 to CC7 as shown in FIGS. 2A to 2C. As explained above, most through silicon vias TSV are of the type shown in FIG. 2A. The address signal and the command signal are supplied from the interface chip IF through the through silicon vies TSV1 of the type shown in FIG. 2A to the core chips CC0 to CC7. Read data and write data are also input and output to/from the interface chip IF through the through silicon vias TSV1 of the type shown in FIG. 2A. On the other hand, the through silicon vias TSV2 of the type shown in FIG. 2B and the through silicon vias TSV3 of the type shown in FIG. 2C are used for supplying information selectively to the core chips CC0 to CC7 that have the same configuration.

Figure 3:
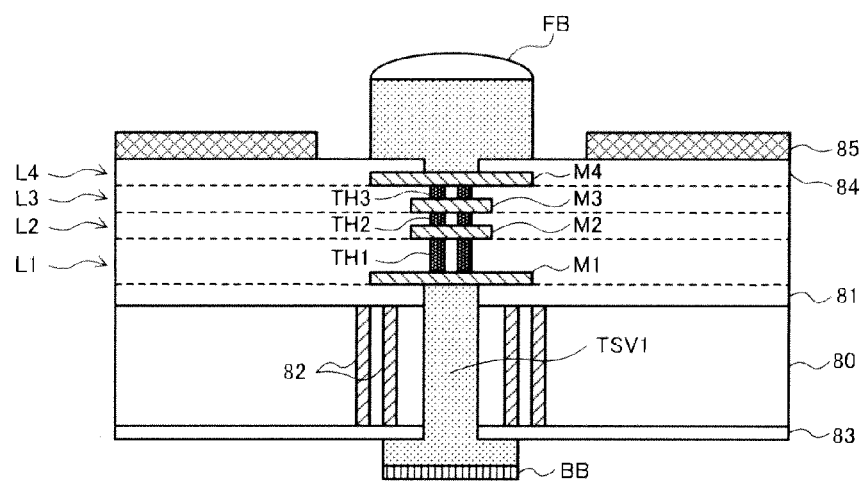
FIG. 3 is a cross-sectional view of a configuration of the through silicon via TSV1 of the type shown in FIG. 2A.

Turning to FIG. 3, the through silicon via TSV1 is provided by penetrating a silicon substrate 80, an interlayer dielectric film 81 on a surface of the silicon substrate 80, and a passivation film 83 on a back surface of the silicon substrate 80. The through silicon via TSV1 is made of Cu (copper), although it is not particularly limited thereto. The surface of the silicon substrate 80 is a device forming surface where a device such as a transistor is formed. An insulating ring 82 is provided around the through silicon via TSV1 and thus insulation between the through silicon via TSV1 and a transistor region is ensured. Two insulating rings 82 are provided in an example of FIG. 3, so that an electrostatic capacity between the through silicon via TSV1 and the silicon substrate 80 is reduced.

An end of the through silicon via TSV1 on a back surface side of the silicon substrate 80 is covered by a back surface bump BB. The back surface bump BB is an electrode that contacts a front surface bump FB provided on an underlying core chip or the interface chip IF and has a configuration of stacking Ni (nickel) and Au (gold), although the material is not particularly limited thereto. The front surface bump FB is connected through pads M1 to $M^4$ provided in wiring layers L1 to L4 and a plurality of through-hole electrodes TH1 to TH3 that connect between the pads to an end of the through silicon via TSV1. The front surface bump FB is made of a SnAg solder, although it is not particularly limited thereto. The diameter of the front surface bump FB and the back surface bump BB is about 20 μm. In the present embodiment, the front surface bump FB and the back surface bump BB are occasionally simply referred to as "electrode".

With the above configuration, the front surface bump FB and the back surface bump BB provided at the same position in a planar view are short-circuited. The front surface bump FB is provided by penetrating a passivation film 84. The surface of the passivation film 84 is covered by a polyimide film 85 except for a region where the front surface bump FB is formed. Connection to an internal circuit (not shown) is performed through an internal wiring (not shown) extracted from the pads M1 to M3 provided in the wiring layers L1 to L3.

Figure 4:
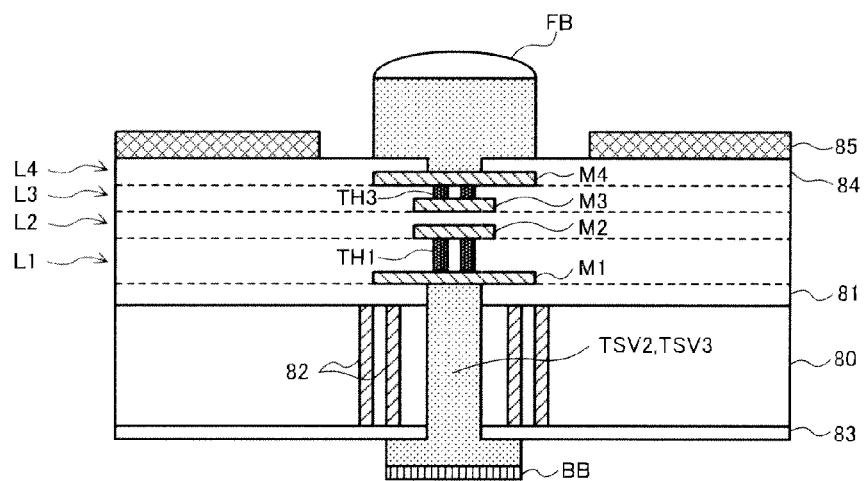
FIG. 4 is a cross-sectional view of a configuration of the through silicon via TSV2 of the type shown in FIG. 2B and the through silicon via TSV3 of the type shown in FIG. 2C.

Turning to FIG. 4, the through silicon vias TSV2 and TSV3 are different from the through silicon via TSV1 shown in FIG. 3 in that the through-hole electrode TH2 for directly connecting the pads M2 and M3 at the same planar position is omitted. According to the through silicon via TSV2 of the type shown in FIG. 2B, the pad M2 is connected to, for example, an output node of the internal circuit 5 shown in FIG. 2 and the pad M3 is connected to, for example, an input node of the internal circuit 5 shown in FIG. 2. Accordingly, the internal circuits 5 provided in the respective core chips CC0 to CC7 are cascade-connected to each other through the through silicon vias TSV2. According to the through silicon via TSV3 of the type shown in FIG. 2C, the pad M2 is connected to the front surface bump FB whose planar position is the same as that of another through silicon via TSV3 and the pad M3 is connected to yet another through silicon via TSV3.

Meanwhile, in the interface chip IF, connection to the core chips CC0 to CC7 has to be performed at the pitch P0 and connection to the interposer IP has to be performed at the pitch P1. Accordingly, the most part of planar positions of the front surface bumps FB are different from those of the back surface bumps BB. The planar position means a position viewed from the stacked direction.

Figure 5:
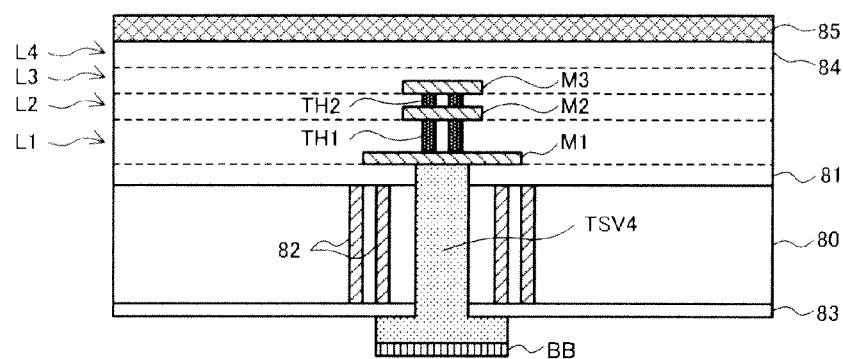
FIG. 5 is a cross-sectional view for explaining a configuration of the back surface bump BB provided on the interface chip IF.
Figure 6:
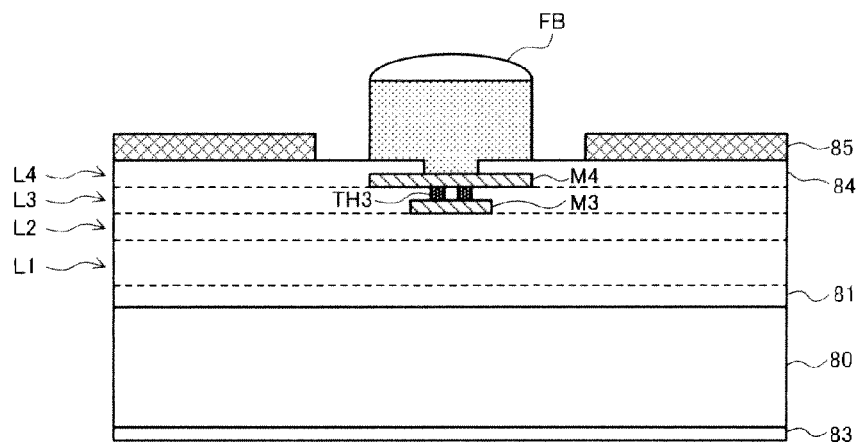
FIG. 6 is a cross-sectional view for explaining a configuration of the front surface bump FB provided on the interface chip IF.

Turning to FIG. 5, the back surface bump BB provided on the interface chip IF is connected through a through silicon via TSV4 to the pads M1 to M3; however, the pad M4 and the front surface bump FB are not provided above the back surface bump BB. Meanwhile, as shown in FIG. 6, the front surface bump FB provided on the interface chip IF is connected to the pads M4 and M3, the pads M2 and M1, the through silicon via TSV, and the back surface bump BB are not provided below the front surface bump FB. The back surface bump BB and the front surface bump FB are connected to a logic circuit (not shown) in the interface chip IF.

A manufacturing method of the semiconductor device 10 according to the first embodiment is explained next.

Figure 7:
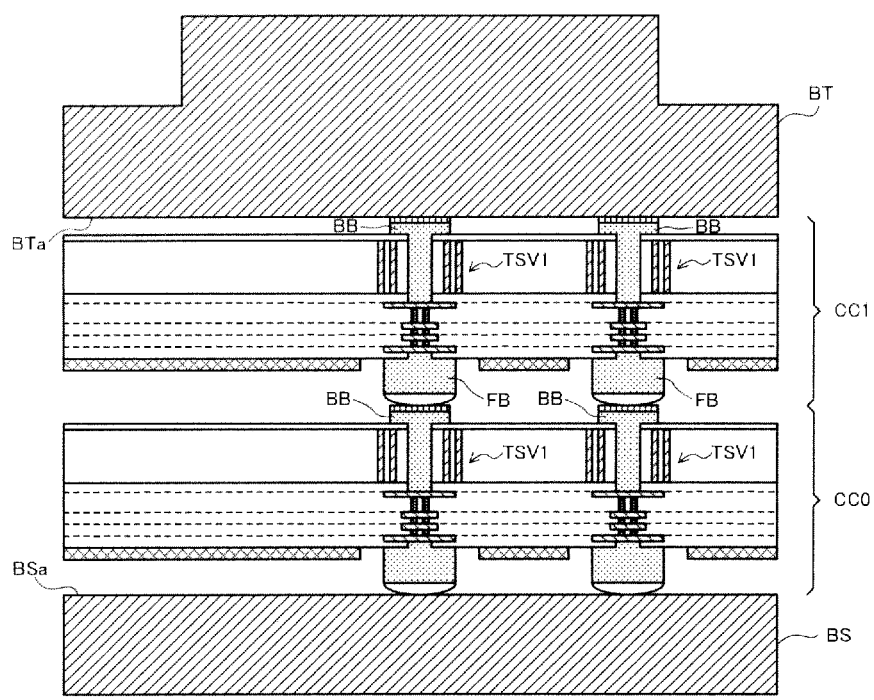
FIG. 7 is a schematic cross-sectional view for explaining a step of stacking the core chip CC1 on the core chip CC0.

As shown in FIG. 7, when the core chip CC1 is stacked on the core chip CC0, a flip-chip bonder that includes a bonding stage BS and a bonding tool BT placed above the bonding stage BS is prepared. The core chip CC0 is then held on a holding surface BSa of the bonding stage BS. The core chip CC1 is held on a holding surface BTa of the bonding tool BT. The core chip CC0 is held so that its surface (one surface) on which the front surface bump FB is formed to face toward the bonding stage BS. The core chip CC1 is held so that its surface (the other surface) on which the back surface bump BB is formed to face toward the bonding tool BT. With this configuration, the front surface bump FB of the core chip CC0 contacts the holding surface BSa of the bonding stage BS. The back surface bump BB of the core chip CC1 contacts the holding surface BTa of the bonding tool BT.

Position information of the core chip CC0 placed on the bonding stage BS is recognized by an alignment mark on its back surface side. The bonding tool BT picks up the core chip CC1 arranged on a chip tray (not shown) by a suction tool, and position information of the core chip CC1 is recognized by an alignment mark on its surface side. With this configuration, accurate position information of the core chips CC0 and CC1 is recognized. By relatively moving the bonding stage BS and the bonding tool BT, the planar position of the back surface bump BB of the core chip CC0 is accurately positioned with respect to the planar position of the front surface bump FB of the core chip CC1. The core chip CC1 is then superimposed on the core chip CC0 in the stacked direction. The back surface bump BB of the core chip CC0 and the front surface bump FR of the core chip CC1 are pressed and bonded to each other.

An alignment accuracy of the bonding tool (a positional accuracy in a planar direction during stacking) is sufficiently small for the diameter of the front surface bump FB and the back surface bump BB. For example, while the diameter of the front surface bump FB and the back surface bump BB is 20 μm, alignment of the bonding tool is about 1 μm. Accordingly, accurate alignment can be performed.

As shown in FIG. 7, when core chips are stacked, the planar position of the front surface bump FB of one core chip matches the planar position of the back surface bump BB of the other core chip. Accordingly, when a load is applied horizontally (uniformly), this load is equally applied to all bumps. Consequently, any bending moment is not applied to the chips and thus the chips are hardly damaged.

Figure 8:
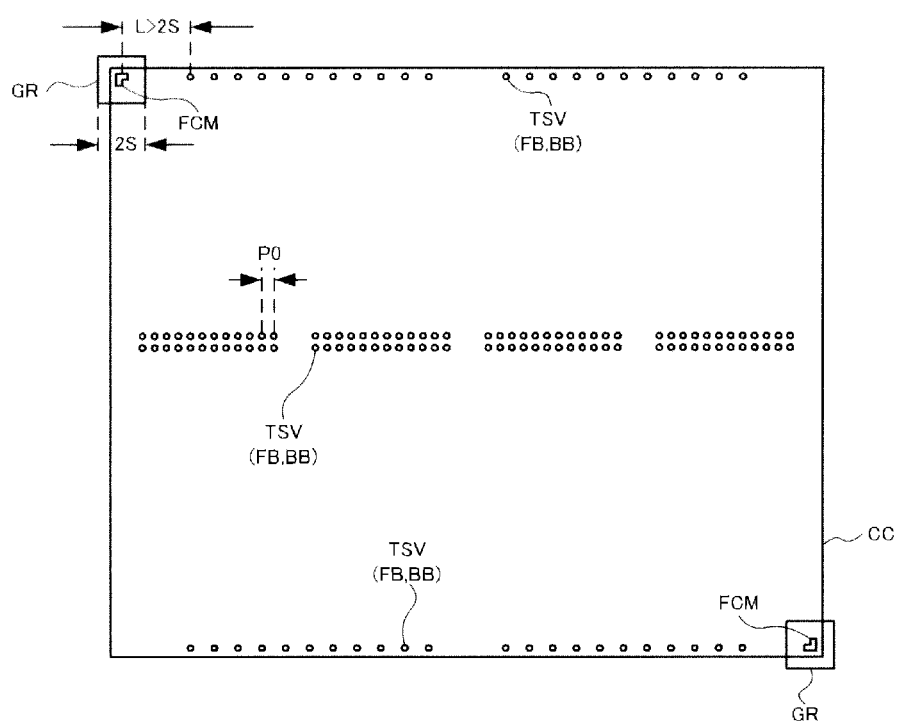
FIG. 8 is a plain view of a preferable layout of the through silicon vias TSV provided in the core chips CC0 to CC7 in the first embodiment.

Turning to FIG. 8, a large number of the through silicon vias TSV are laid out at a substantially central part of a chip at the pitch P0. These through silicon vias TSV are used for transmitting signals and supplying power and any of the through silicon vies TSV1 to TSV3 shown in FIGS. 3 and 4. Therefore, the planar position of the front surface bump FB matches the planar position of the back surface bump BB. The through silicon vias TSV are also provided at two sides of the chip (an upper side and a lower side in FIG. 8). These through silicon vias are for support so as to suppress a warpage of the core chip. Also in the supporting through silicon vias TSV, the planar position of the front surface bump FB matches the planar position of the back surface bump BB. The supporting through silicon vias TSV do not need to be formed at the minimum pitch P0 and can be arranged at a larger pitch.

An L-shaped (or cross-shaped) alignment mark FCM is provided at diagonal positions of the chip. The alignment mark FCM can have the same configuration as that of the through silicon via TSV4 shown in FIG. 5. When the core chips CC0 to CC7 are picked up by the bonding tool BT, the bonding tool BT that a concave GR is provided at a position corresponding to the alignment mark FCM so that the alignment mark FCM is not covered is used.

A pick-up accuracy at the time of picking up a semiconductor chip by the bonding tool BT (a positional accuracy between the semiconductor chip and the bonding tool BT in a planar direction) is significantly lower than the positioning accuracy during stacking (about 1 μm). This is because when a semiconductor chip placed on a chip tray is picked up, alignment is not performed using the alignment mark FCM and thus a positional accuracy S of the semiconductor chip is about 100 to 200 μm. Accordingly, to reliably position the alignment mark FCM within the concave GR of the bonding tool BT, a side of the concave GR needs to be twice or more of the pick-up accuracy S (=2S). Further, to make the back surface bump BB correctly contact the holding surface BTa of the bonding tool BT, a shortest distance L between the alignment mark FCM and the through silicon via TSV needs to be twice or more of the pick-up accuracy S (L>2S). When the concave GR of the bonding tool BT and the positional relationship between the alignment mark FCM and the through silicon via TSV are designed so as to satisfy these conditions, defective read of the alignment mark FCM does not occur. In addition, the back surface bumps BB of all the through silicon vias TSV can correctly contact the holding surface BTa of the bonding tool BT.

Figure 9:
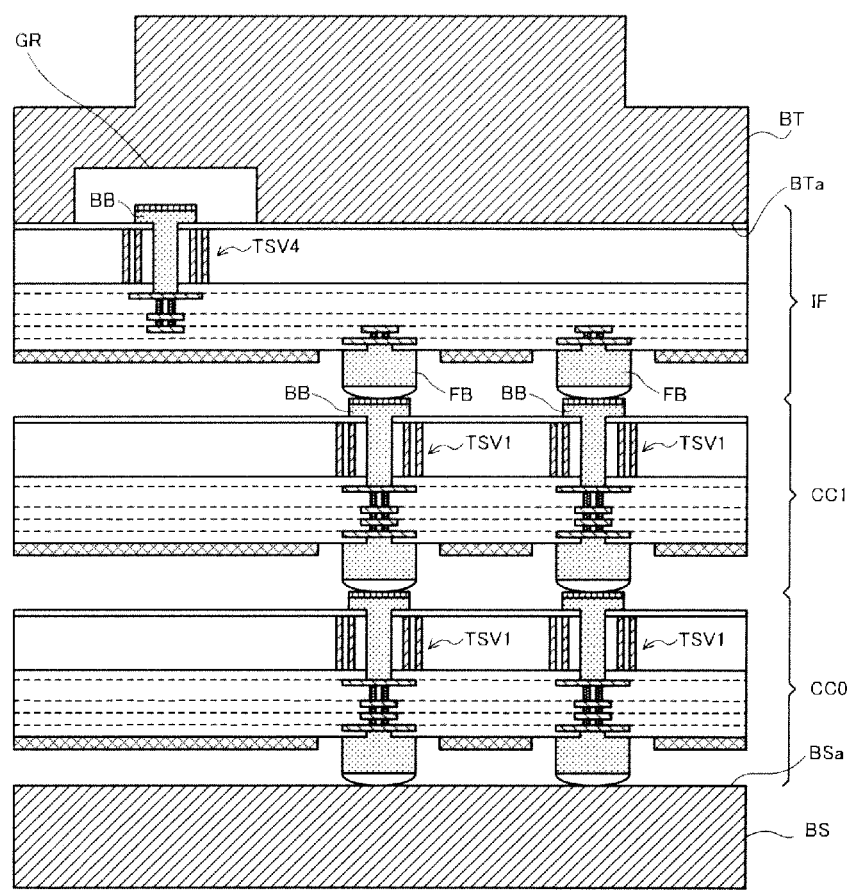
FIG. 9 is a schematic cross-sectional view for explaining a step of stacking the interface chip IF on a core chip in the first embodiment.

While the semiconductor device 10 according to the first embodiment has a configuration of stacking eight core chips (CC0 to CC7), only two core chips (CC0 and CC1) are shown in FIG. 9 for easier understanding of the drawing.

As shown in FIG. 9, when the interface chip IF is stacked on a core chip, a stack of the core chips (CC0 and CC1) is held on the holding surface BSa of the bonding stage BS and the interface chip IF is held on the holding surface BTa of the bonding tool BT. The stack of core chips is held so that a surface (one surface) of the core chip CC0 where the front surface bump FB is formed to face toward the bonding stage BS. Therefore, the front surface bump FE of the core chip CC0 contacts the holding surface BSa of the bonding stage BS. Position information of the core chip CC1 placed on the bonding stage BS is recognized by an alignment mark on its back surface side.

Meanwhile, the bonding tool BT picks up the interface chip IF arranged on a chip tray (not shown) by a suction tool and holds the interface chip IF so that its surface where the back surface bump BB is formed (the other surface) to face toward the bonding tool BT. The holding surface BTa of the bonding tool BT is provided with the concave GR at a position corresponding to the back surface bump BB, and the interface chip IF is held so that the back surface bump BB is accommodated in the concave GR. With this configuration, the back surface of the interface chip IF contacts the flat holding surface BTa of the bonding tool BT and the back surface bump BB does not contact the holding surface BTa. Position information of the interface chip IF is recognized by an alignment mark on its surface side.

By relatively moving the bonding stage BS and the bonding tool BT, the planar position of the back surface bump BB of the core chip CC1 is correctly positioned with respect to the planar position of the front surface bump FB of the interface chip IF. The interface chip IF is then superimposed on the core chip CC1 in the stacked direction. With this process, the back surface bump BB of the core chip CC1 and the front surface bump FB of the interface chip IF are pressed and bonded to each other.

Figure 10:
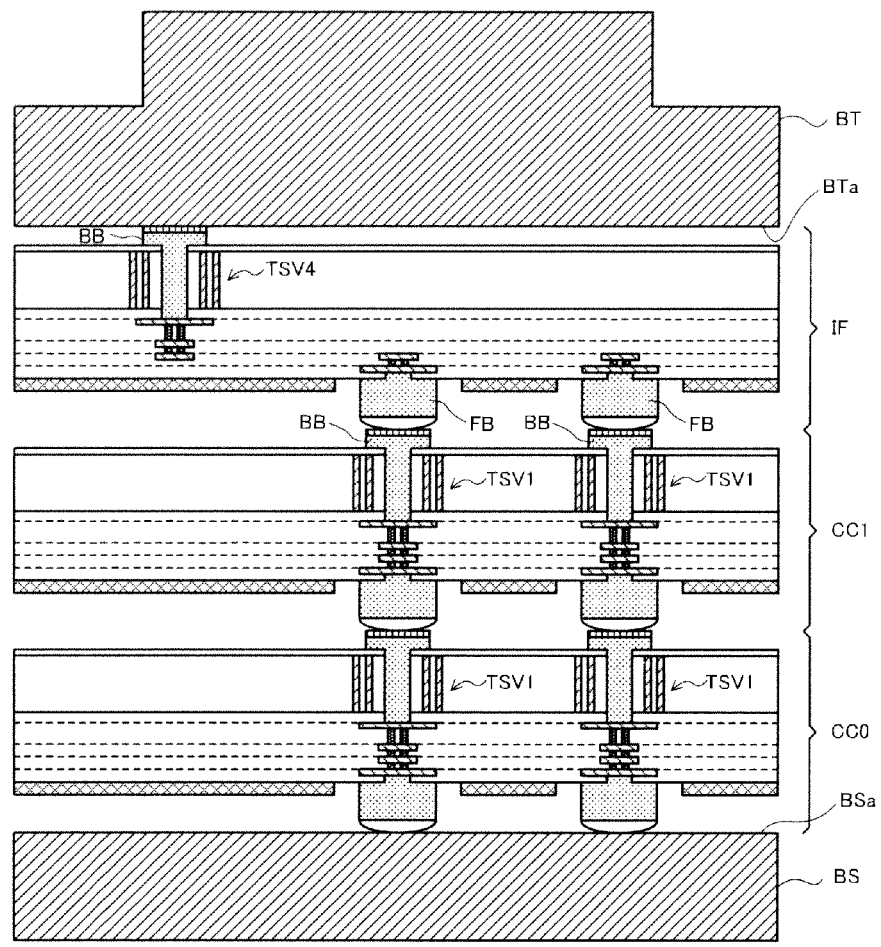
FIG. 10 is a schematic cross-sectional view for explaining a step of stacking the interface chip IF on a core chip that the inventor have conceived as a prototype in the course of making the present invention.

In the interface chip IF, the planar position of the front surface bump FB does not match the planar position of the back surface bump BB. When the bonding tool BT that does not have the concave GR is used, the back surface bump BB of the interface chip IF is pressed by the bonding tool BT as shown in FIG. 10. Because the front surface bump FB does not exist on the side of the interface chip IF opposite to the side that the back surface bump BB is formed, a downward bending stress is applied to this portion of the chip. Meanwhile, a stress is applied from the core chip side to a portion that the front surface bump FB is formed so as to push the interface chip IF upward. Accordingly, even when a load is horizontally (uniformly) applied at the time of stacking, a bending moment is applied to the interface chip IF and thus the chip may be damaged.

According to the first embodiment, the bonding tool BT is provided with the concave GR and a stacking operation is performed while the back surface bump BB is accommodated in the concave GR. Accordingly, a bending moment is hardly generated in the interface chip IF. Therefore, damage of the interface chip IF at the time of stacking can be prevented.

Figure 11:
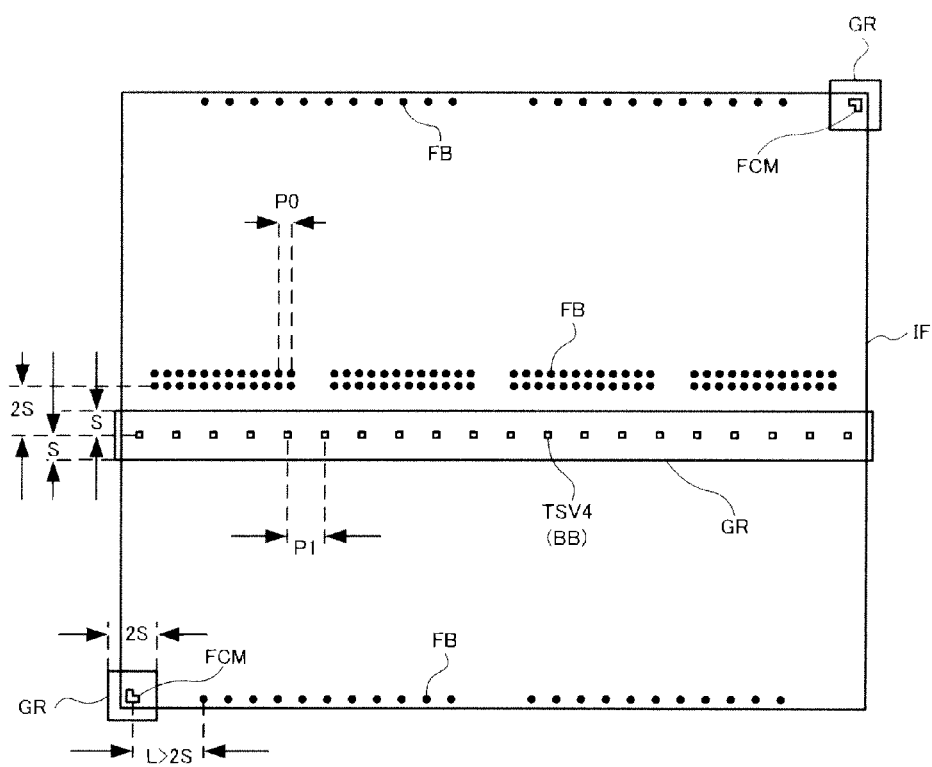
FIG. 11 is a plain view of a layout of the through silicon vias TSV provided in the interface chip IF in the first embodiment.

With reference to FIG. 11, the front surface bumps FB are indicated by black dots, and the through silicon via TSV4 and the back surface bump BB are indicated by white squares. Because the front surface bump FB is an electrode that contacts the back surface bump BB of the core chip CC1, its planar position matches that of the through silicon via TSV shown in FIG. 8. Therefore, the pitch of forming the front surface bump FB is P0. The through silicon via TSV4 and the back surface bump BB are laid out at planar positions different from that of the front surface bump FB, and the pitch of forming the through silicon via TSV4 and the back surface bump BB is P1.

As explained above, the pick-up accuracy S at the time of picking up a semiconductor chip by the bonding tool BT is significantly lower than the alignment accuracy at the time of stacking (about 1 μm). To reliably accommodate the back surface bump BB in the concave GR of the bonding tool BT, a distance between the back surface bump BB and a side of the concave GR needs to be equal to the pick-up accuracy S or longer. Further, to make a side opposite to the side that the front surface bump FB is formed correctly contact the holding surface BTa of the bonding tool BT, a planar shortest distance between the back surface bump BB and the front surface bump FB need to be twice or more of the pick-up accuracy S (2S). The relationship among the alignment mark FCM, the concave GR, and the front surface bump FB is as explained with reference to FIG. 8.

The concave GR of the bonding tool BT and the positional relationships between the back surface bump BB and the front surface bump FB and between the alignment mark FCM and the front surface bump FB are designed so that these conditions are satisfied. Accordingly, any bending moment is not generated on the interface chip IF during stacking, and defective read of the alignment mark FCM does not occur.

A second embodiment of the present invention is explained next.

The second embodiment is an example of forming the through silicon via TSV1 of the type shown in FIG. 3 in the interface chip IF. That is, most through silicon vias TSV provided in the interface chip IF are the through silicon vias TSV4 of the type shown in FIG. 5 and laid out at positions different from that of the front surface bump FB in a planar point of view. However, the interface chip IF is preferably connected to the core chips CC0 to CC7 by the through silicon via TSV1 with low resistance in power supplies or the like. Accordingly, in the second embodiment, such through silicon via TSV1 is provided in the interface chip IF. Among through silicon vias provided in the interface chip IF, through silicon vias in columns T1 and T8 shown in FIG. 1 are the through silicon vias TSV1. Through silicon vias in other columns T9 to T12 are the through silicon vias TSV4 of the type shown in FIG. 5.

Figure 12:
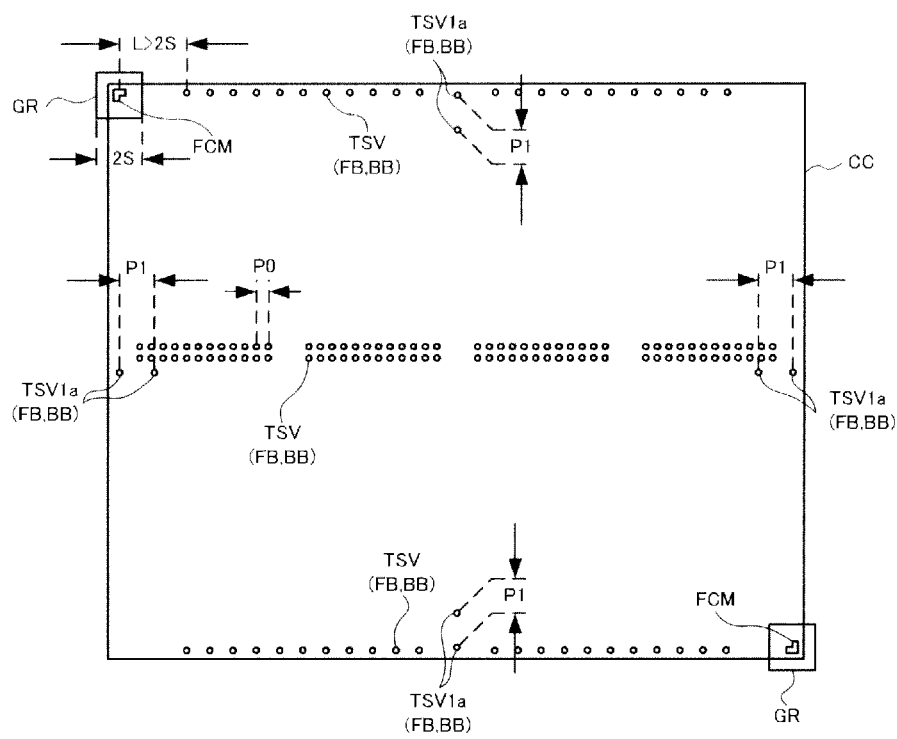
FIG. 12 is a plain view of a preferable layout of the through silicon vias TSV provided in the core chips CC0 to CC7 in the second embodiment.

In an example of FIG. 12, two through silicon vias TSV1a are added at a substantially central part of each side and the pitch is designed to be P1 or more. These through silicon vias TSV1a are for a power supply, for example. The pitch of these added through silicon vias TSV1a is P1 or more because through silicon vies on the interface chip IF connected to these through silicon vias TSV1a are the through silicon vias TSV1 of the type shown in FIG. 3 and the pitch (P1) allowed for the interposer IP on the back surface side of the interface chip IF has to be ensured.

Figure 13:
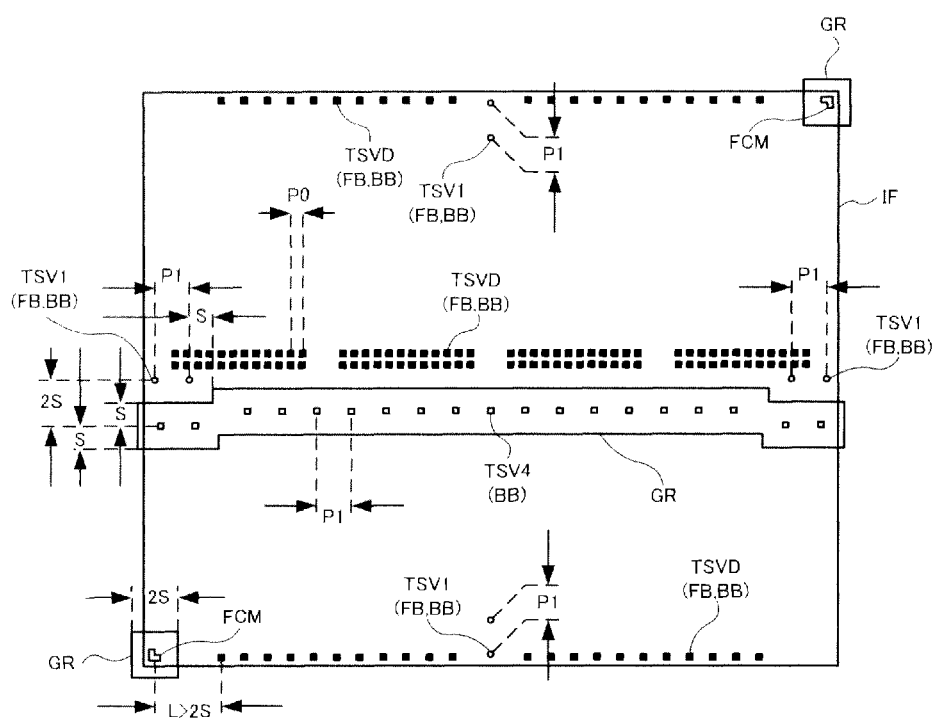
FIG. 13 is a plain view of a layout of the through silicon vias TSV provided in the interface chip IF in the second embodiment.

With reference to FIG. 13, dummy through silicon vias TSVD are indicated by black squares, and the through silicon via TSV4 and the back surface bump BB are indicated by white squares. The dummy through silicon via TSVD does not contribute to transmission of signals and power, and its configuration is the same as that of the through silicon via TSV2 or TSV3 shown in FIG. 4. Therefore, the dummy through silicon via includes the front surface bump FB and the back surface bump BB and their planar positions are the same. The dummy through silicon vias TSVD are placed at positions corresponding to the front surface bumps FB of the through silicon vies TSV1 to TSV3 provided in the core chips CC0 to CC7.

Figure 14:
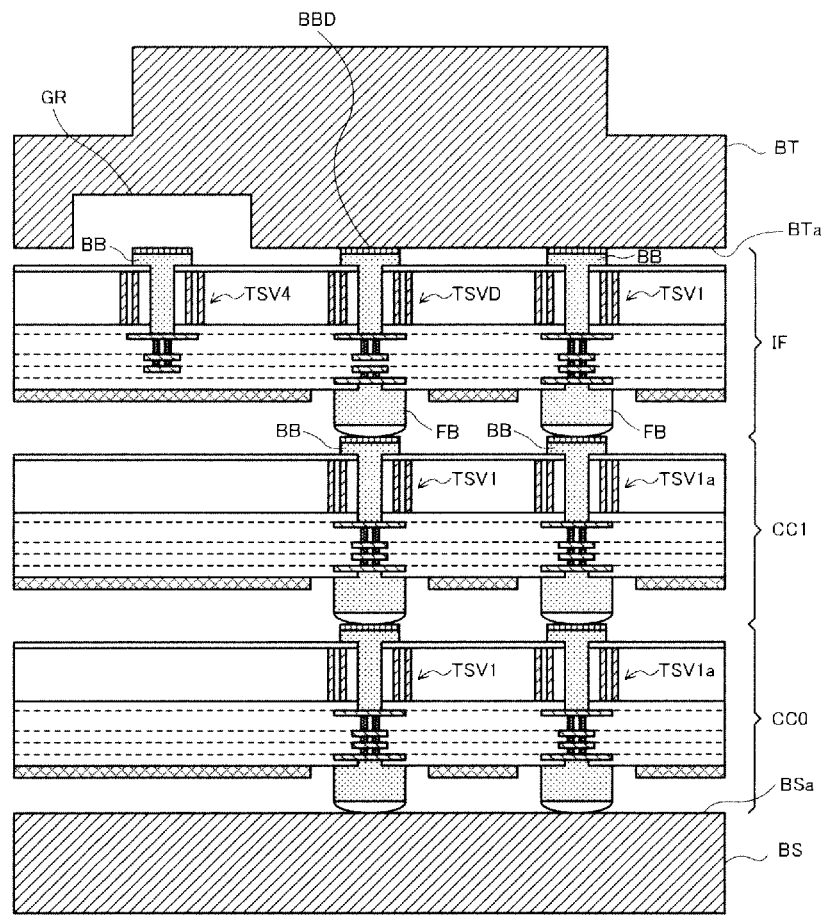
FIG. 14 is a schematic cross-sectional view for explaining a step of stacking the interface chip IF on a core chip in the second embodiment.

Only two core chips (CC0 and CC1) are shown in FIG. 14 for easier understanding of the drawing.

As shown in FIG. 14, the concave GR is provided at a position corresponding to the back surface bump BB of the through silicon via TSV4 on the holding surface BTa of the bonding tool BT in the second embodiment. The interface chip IF is held so that this back surface bump BB is accommodated in the concave GR. The concave GR is not provided at positions corresponding to the back surface bumps BB of the through silicon via TSV1 and the dummy through silicon via TSVD. The back surface bumps BB of the through silicon via TSV1 and the dummy through silicon via TSVD contact the flat holding surface BTa of the bonding tool BT, while the back surface bump BB of the through silicon via TSV4 does not contact the holding surface BTa.

By relatively moving the bonding stage BS and the bonding tool BT, the planar position of the back surface bump BB of the core chip CC1 is accurately positioned with respect to the planar position of the front surface bump FB of the interface chip IF. The interface chip IF is then superimposed on the core chip CC1 in the stacked direction. With this configuration, the back surface bump BB of the core chip CC1 and the front surface bump FB of the interface chip IF are pressed and bonded to each other.

As shown in FIG. 14, the planar position of the back surface bump BB that contacts the holding surface BTa of the bonding tool BT matches the planar position of the front surface bump FB that contacts the back surface bump BB of the core chip CC1 in the second embodiment. When a load is horizontally applied at the time of stacking, the load is equally applied to all bumps. Accordingly, any bending moment is not applied to the interface chip IF and the chip is hardly damaged.

Figure 15:
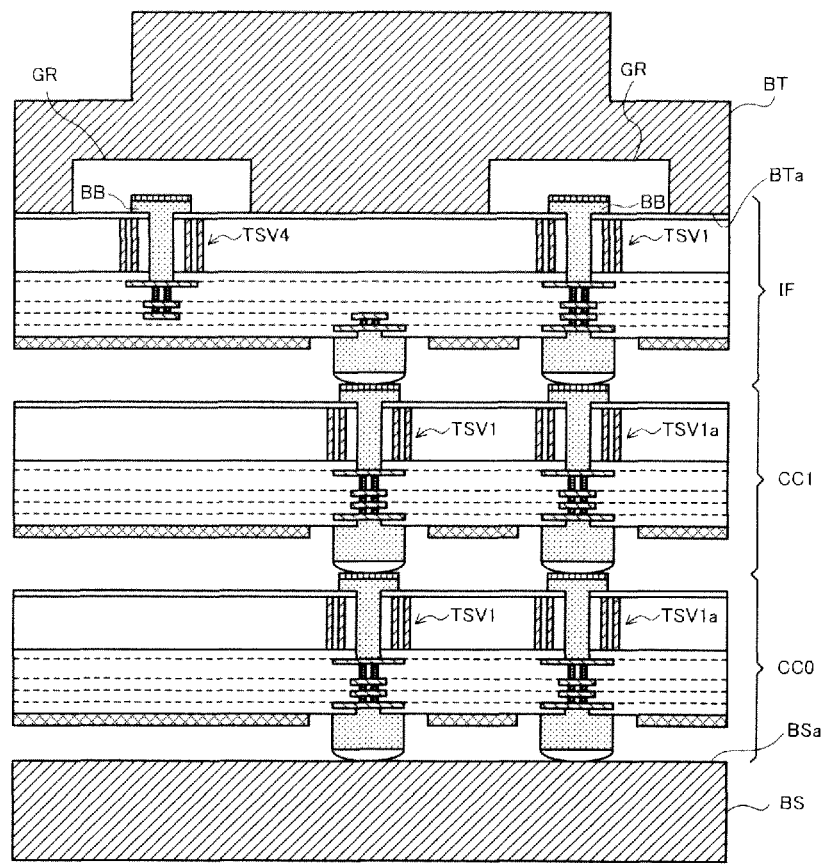
FIG. 15 is a schematic cross-sectional view for explaining a step of stacking the interface chip IF on a core chip that the inventor have conceived as a prototype in the course of making the present invention.

As shown in FIG. 15, instead of providing the dummy through silicon via TSVD, the concave OR is probably provided at a position corresponding to the back surface bump BB of the through silicon via TSV1. In this case, the through silicon via TSV1 is not pressed by the bonding tool BT. Therefore, a stress acts from the core chip side so as to push the through silicon via TSV1 upward and the interface chip IF may be damaged by a bending moment. In contrast, such a problem does not occur in the second embodiment.

Also in the second embodiment, to reliably accommodate the back surface bump BB of the through silicon via TSV4 in the concave GR of the bonding tool BT, the distance between the back surface bump BB and a side of the concave GR needs to be equal to or longer than the pick-up accuracy S. Further, to make the back surface bumps BB of the through silicon via TSV1 and the dummy through silicon via TSVD correctly contact the holding surface BTa of the bonding tool BT, the planar shortest distance between the back surface bump BB of the through silicon via TSV4 and the back surface bumps BB of the through silicon via TSV1 and the dummy through silicon via TSVD needs to be twice (2S) or more of the pick-up accuracy S. It suffices that the distance between the through silicon via TSV1 and the dummy through silicon via TSVD is equal to or longer than the pitch P0. This distance can be set to be shorter than the pick-up accuracy of the bonding tool BT. The relationship among the alignment mark FCM, the concave GR, and the front surface bump FB is as explained with reference to FIG. 8.

When the concave GR of the bonding tool BT and the positional relationships between the back surface bumps BB and between the alignment mark FCM and the back surface bump BB are designed so that these conditions are satisfied, any bending moment is not generated on the interface chip IF during stacking, and defective read of the alignment mark FCM does not occur.

The present invention has been described so far with reference to several embodiments thereof. Such embodiments have been given by way of illustration. It will be understood by those skilled in the art that various modifications and alterations may be made within the scope of claims of the present invention, and such modifications and alterations are also intended to fall within the scope of claims of the present invention. The description of the specification and the drawings are therefore to be considered exemplary, not restrictive.

While the invention made by the present inventor has been explained based on embodiments thereof, the present invention is not limited to these embodiments, and it is needless to mention that various changes can be made within the scope of the invention.

While a case of flip-chip bonding of a semiconductor chip on another semiconductor chip has been explained in the above embodiments, the present invention can be also applied to a case of flip-chip bonding of the semiconductor chip on a wiring substrate.

While a case of flip-chip bonding of a semiconductor chip that has bump electrodes on its top and bottom faces on another semiconductor chip that has bump electrodes on its top and bottom faces has been explained in the above embodiments, the present invention can be also applied to a case of flip-chip bonding of the semiconductor chip on another semiconductor chip that has electrodes only on its surface.

While a case of flip-chip bonding of an interface chip on a memory chip has been explained in the above embodiments, the present invention is not limited thereto. The present invention can be also applied to semiconductor chips having any circuit as long as the arrangement of bump electrodes on a top face is different from that on a bottom face.

While a case of stacking semiconductor chips of the same chip size has been explained in the above embodiments, as long as the arrangement of bump electrodes on a top face is different from that on a bottom face, the present invention can be also applied to semiconductor chips of different chip sizes.

According to the above embodiments, a concave is formed in a bonding tool and a semiconductor chip that the arrangement of bump electrodes on its top face is different from that on its bottom face is held by the bonding tool. A concave can be formed in a stage and a semiconductor chip that the arrangement of bump electrode on its top face is different from that on its bottom face can be held by the stage.

What is claimed is:

1. A method of manufacturing a semiconductor device comprising:
preparing first and second semiconductor chips, the first semiconductor chip including a first electrode formed on one surface thereof and a second electrode formed on the other surface thereof so as to overlap the first electrode as viewed from a stacking direction, and the second semiconductor chip including a third electrode formed on one surface thereof and a fourth electrode formed on the other surface thereof so as not to overlap the third electrode as viewed from the stacking direction; and
stacking the first and second semiconductor chips in the stacking direction so that the second electrode is connected to the third electrode by using a bonding tool including a concave at a position corresponding to the fourth electrode.

2. The method of manufacturing the semiconductor device as claimed in claim 1, wherein the bonding tool is made to contact the other surface of the second semiconductor chip at the stacking.

3. The method of manufacturing the semiconductor device as claimed in claim 1, wherein
the second semiconductor chip further includes a fifth electrode formed on the other surface so as to overlap the third electrode as viewed from the stacking direction, and
the bonding tool is made to contact the fifth electrode at the stacking.

4. The method of manufacturing the semiconductor device as claimed in claim 3, wherein the fifth electrode is electrically connected to the third electrode.

5. The method of manufacturing the semiconductor device as claimed in claim 3, wherein
the second semiconductor chip further includes a sixth electrode formed on the one surface and a dummy electrode formed on the other surface so as to overlap the sixth electrode as viewed from the stacking direction, and
the bonding tool is made to contact the fifth electrode and the dummy electrode at the stacking.

6. The method of manufacturing the semiconductor device as claimed in claim 5, wherein
the first semiconductor chip further includes a seventh electrode formed on the one surface and an eighth electrode formed on the other surface so as to overlap the seventh electrode as viewed from the stacking direction, and
the sixth electrode is connected to the eighth electrode at the stacking.

7. The method of manufacturing the semiconductor device as claimed in claim 1, wherein a distance between the third electrode and the fourth electrode as viewed from the stacking direction is twice or more of a pick-up accuracy of the bonding tool.

8. The method of manufacturing the semiconductor device as claimed in claim 6, wherein a distance between the fourth electrode and the dummy electrode as viewed from the stacking direction is twice or more of a pick-up accuracy of the bonding tool.

9. The method of manufacturing the semiconductor device as claimed in claim 8, wherein a distance between the fifth electrode and the dummy electrode as viewed from the stacking direction is less than the pick-up accuracy of the bonding tool.

10. The method of manufacturing the semiconductor device as claimed in claim 1, wherein the one surface of each of the first and second semiconductor chips is an active surface on which transistors are formed.

* * * * *